(12) United States Patent
Ohkawa et al.

(10) Patent No.: US 6,833,725 B2
(45) Date of Patent: Dec. 21, 2004

(54) SEMICONDUCTOR CHARACTERISTIC EVALUATION APPARATUS

(75) Inventors: Shin-ichi Ohkawa, Yamato (JP); Masakazu Aoki, Tokorozawa (JP)

(73) Assignee: Semiconductor Technology Academic Research Center, Kanagawa (JP)

(*) Notice: Subject to any disclaimer, the term of this patent is extended or adjusted under 35 U.S.C. 154(b) by 0 days.

(21) Appl. No.: 10/600,800

(22) Filed: Jun. 19, 2003

(65) Prior Publication Data

US 2004/0008051 A1 Jan. 15, 2004

(30) Foreign Application Priority Data

Jun. 21, 2002 (JP) .................................... 2002-181459

(51) Int. Cl.[7] ............................................. G01R 31/02
(52) U.S. Cl. ................................................... 324/765
(58) Field of Search ............................... 324/765, 763, 324/754, 158.1; 439/14, 17; 361/748, 760, 767, 688

(56) References Cited

U.S. PATENT DOCUMENTS

| | | | | |
|---|---|---|---|---|
| 5,506,516 A | * | 4/1996 | Yamashita et al. | 324/770 |
| 6,326,801 B1 | * | 12/2001 | Whetsel | 324/765 |
| 6,400,173 B1 | * | 6/2002 | Shimizu et al. | 324/765 |
| 6,512,392 B2 | * | 1/2003 | Fleury et al. | 324/765 |
| 6,727,722 B2 | * | 4/2004 | Whetsel | 324/765 |
| 6,727,723 B2 | * | 4/2004 | Shimizu et al. | 324/765 |

OTHER PUBLICATIONS

Chen, J.C., et al., "An On–Chip, Interconnect Capacitance Characterization Method With Sub–Femto–Farad Resolution," *Proceedings of the IEEE, International Conference on Microelectronic Test Structures*, Monterey, California, vol. 10, Mar. 1997, pp. 77–80.

* cited by examiner

*Primary Examiner*—Anjan Deb
*Assistant Examiner*—Donald M Lair
(74) *Attorney, Agent, or Firm*—Christensen O'Connor Johnson Kindness PLLC

(57) ABSTRACT

On a basic measurement unit arranged in a lattice shape on a chip, a resistance measurement circuit, a capacity measurement circuit, an n-type MOS transistor measurement circuit, a p-type MOS transistor measurement circuit, and a ring oscillator measurement circuit are mounted by several tens of patterns. Each measurement circuit mounted by several tens of patterns is connected to a measurement bus to constitute a measurement bus net in accordance with measured items. Switching of connection of the measurement bus net with a measurement terminal pad is electrically controlled properly by X, Y address selection signals outputted from X, Y address decoders to X, Y address selection signal lines.

15 Claims, 10 Drawing Sheets

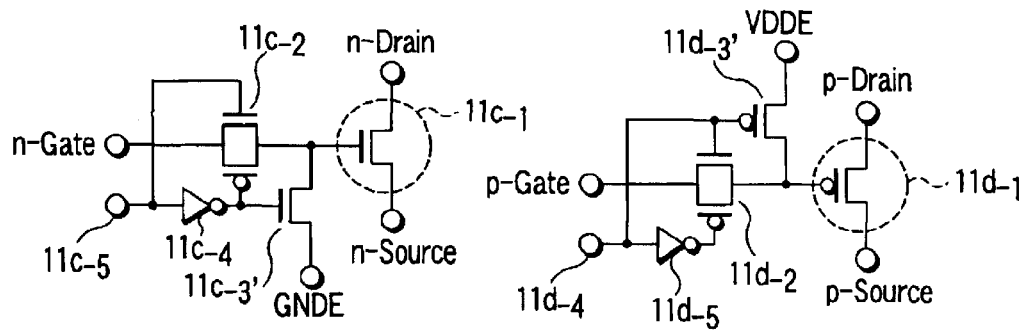
F I G. 12      F I G. 13
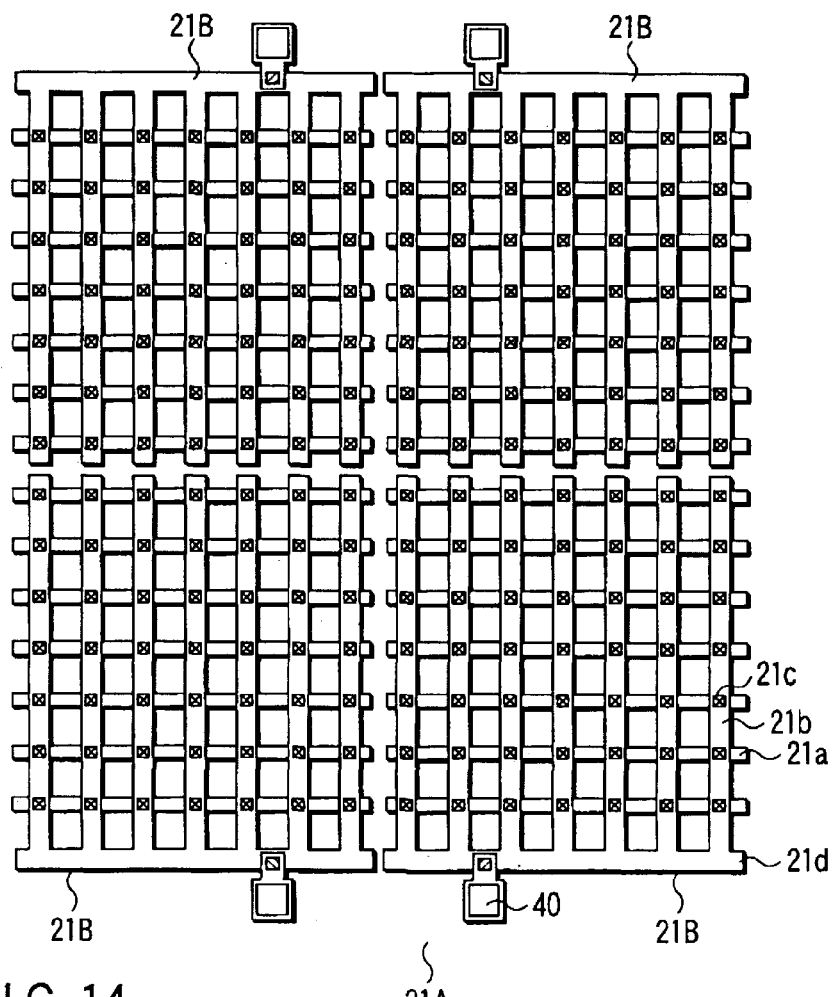
F I G. 14

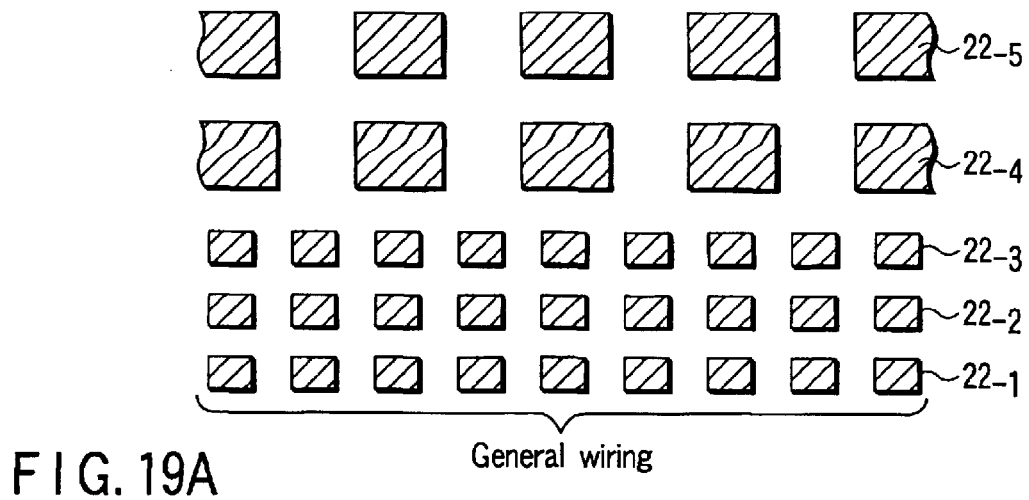
FIG. 19A  General wiring
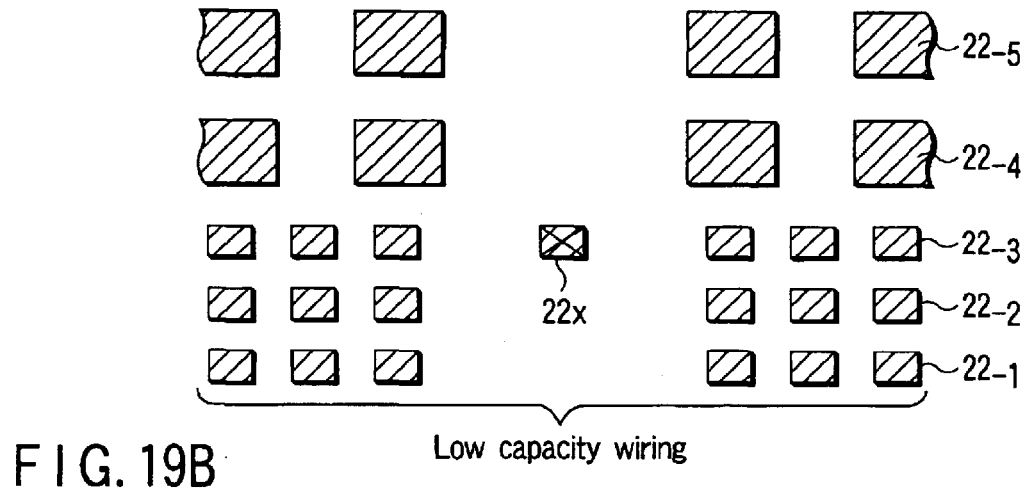
FIG. 19B  Low capacity wiring
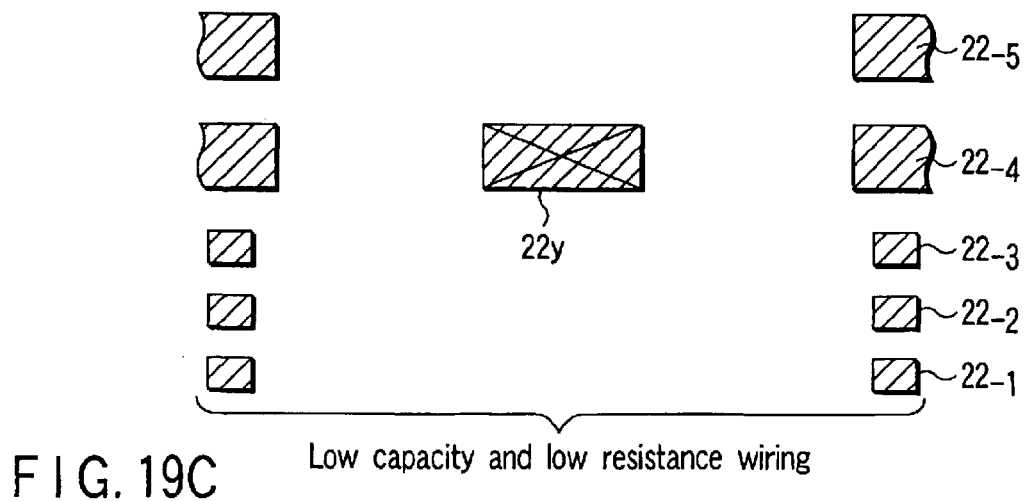
FIG. 19C  Low capacity and low resistance wiring

SEMICONDUCTOR CHARACTERISTIC EVALUATION APPARATUS

CROSS-REFERENCE TO RELATED APPLICATIONS

This application is based upon and claims the benefit of priority from the prior Japanese Patent Application No. 2002-181459, filed Jun. 21, 2002, the entire contents of which are incorporated herein by reference.

BACKGROUND OF THE INVENTION

1. Field of the Invention

The present invention relates to a semiconductor characteristic evaluation apparatus. More particularly, it relates to an element characteristic/circuit characteristic evaluation apparatus which evaluates a fluctuation of element characteristics or circuit characteristics in a semiconductor integrated circuit (hereinafter, referred to as an LSI (large scale integrated circuit)).

2. Description of the Related Art

In LSIs after a 0.1 μm generation, a fluctuation of element parameters must be taken into consideration, because an influence of the fluctuation of the element parameters becomes obvious, as the LSIs are more miniaturized and set to a lower voltage. In order to incorporate such a fluctuation of the element parameters into a design of the LSIs, it is necessary to accurately evaluate a fluctuation of element characteristics in an LSI chip, in a wafer surface, between wafers and between lots. Especially, the evaluation in the LSI chip is also important in order to accurately estimate a fluctuation of circuit characteristics of the entire LSI chip.

Conventionally, the characteristics of the elements have individually been measured for the fluctuation evaluation. For example, element evaluation patterns necessary for the measurement are all arranged on the chip to prepare an evaluation chip. Usually, the arrangement of the element evaluation patterns needs an area of about several hundred μm square. Accordingly, one or several chips are prepared, and all the element evaluation patterns are mounted thereon in accordance with the number of items to be measured. Then, during the measurement, the evaluation chips are mechanically moved in sequence to probe the individual element evaluation patterns.

Such a conventional method has the following drawbacks.

(1) Because of a large area of each element evaluation pattern, manufacturing costs of the evaluation chip become high. Additionally, since the element evaluation patterns are mounted on the chip in a wide range, it is difficult to distinguish a cause of a fluctuation correlation between elements from another, i.e., element characteristics from a difference in distances or positions on the chip.

(2) A layout of the evaluation chips is far apart from a normal LSI. That is, the evaluation chips are laid out where probe pads are bedded. Accordingly, the evaluation chips are manufactured under conditions different from original process tuning conditions. Therefore, there is a problem that an obtained result of measurement is not accurate reflection of a fluctuation of element characteristics in the real LSI.

(3) The measurement is accompanied by mechanical movement and mechanical contact by a probe. Accordingly, measuring time becomes considerable to increase evaluation costs. Additionally, since the mechanical contact is repeated by a number of times (several tens of thousands in some cases), errors easily occur due to a guarantee of stability and a fluctuation of contact resistance.

(4) The number of element evaluation patterns to be mounted on one evaluation chip is limited to several hundreds to several thousands. For the same element evaluation patterns, only several to several tens can be mounted on one evaluation chip. By such mounted numbers, it is impossible to carry out satisfactory statistical evaluation. Evaluation is carried out by measuring several tens of evaluation chips, but it is nothing more than average evaluation for a number of evaluation chips. Consequently, it is impossible to evaluate a difference among the evaluation chips, e.g., dependence on positions on the wafer.

(5) It is difficult to verify a correlation between obtained measurement data regarding the fluctuation of the element characteristics and the fluctuation of real circuit characteristics. A small volume of measurement data, a distance between the element evaluation patterns on the evaluation chip, and an inconsistent layout (e.g., a difference in pattern density or degree of miniaturization) are obstacles.

As against the aforementioned conventional method for mechanically moving the evaluation chips, there has been invented a method for electrically probing the element evaluation patterns, i.e., a method for electrically switching selection of patterns to be measured. In the case of this method, however, it has been considered that measurement accuracy necessary for evaluation cannot be secured due to an influence of an error caused by a leakage current of a changeover switch or a potential error caused by wiring resistance. Thus, the aforementioned method for mechanically moving the evaluation chips is still a mainstream evaluation apparatus.

BRIEF SUMMARY OF THE INVENTION

An object of the present invention is to provide a semiconductor characteristic evaluation apparatus which can accurately evaluate a fluctuation of element characteristics and a fluctuation of circuit characteristics by electrically switching a measurement circuit system without any mechanical movement of an evaluation chip, and secure sufficient measurement accuracy necessary for evaluation.

According to a first aspect of the present invention, there is provided a semiconductor characteristic evaluation apparatus comprising a plurality of measurement units arranged on a chip, on which a plurality of measured patterns of components configuring a semiconductor integrated circuit and varying in kind from component to component are mounted; a measurement bus group arranged above the plurality of measurement units and connected to the plurality of measured patterns to configure a measurement circuit system in accordance with measured items of the components; a plurality of measurement pads, on the chip, which are arranged in a region other than an arrangement region of the plurality of measurement units and to which a measuring device is connected; a plurality of selection switches which select, in accordance with the measured items of the components, a measurement bus group configuring the measurement circuit system in accordance with the measured items and which connect the group to the plurality of measurement pads; and a control circuit which electrically controls switching of the plurality of selection switches in accordance with the measured items of the components.

According to the foregoing constitution, the components constituting the semiconductor integrated circuit mounted on the plurality of measurement units arranged on the chip are connected to the plurality of measured patterns varied in kind from component to component, whereby the connection between the measurement bus group constituting the measurement circuit system and the measurement pad in accordance with the measured items of the components is electrically controlled by the selection switch. The measurement bus group and the selection switch enable an optimal structure of the measurement circuit system and optimal application of a bias voltage. As a result, it is possible to prevent an influence of an error caused by leakage current of the changeover switch or a potential error caused by wiring resistance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 12 is a view showing another example of an n-type MOS transistor measurement circuit.

FIG. 13 is a view showing another example of a p-type MOS transistor measurement circuit.

FIG. 14 is a view showing another constitutional example of a mesh measurement bus.

FIGS. 19A to 19C are sectional views showing constitutional examples of capacity measurement wirings in the element characteristic/circuit characteristic evaluation apparatus of FIG. 1.

DETAILED DESCRIPTION OF THE INVENTION

Embodiments of the present invention will hereinafter be described in reference to the drawings.

Figure 1:
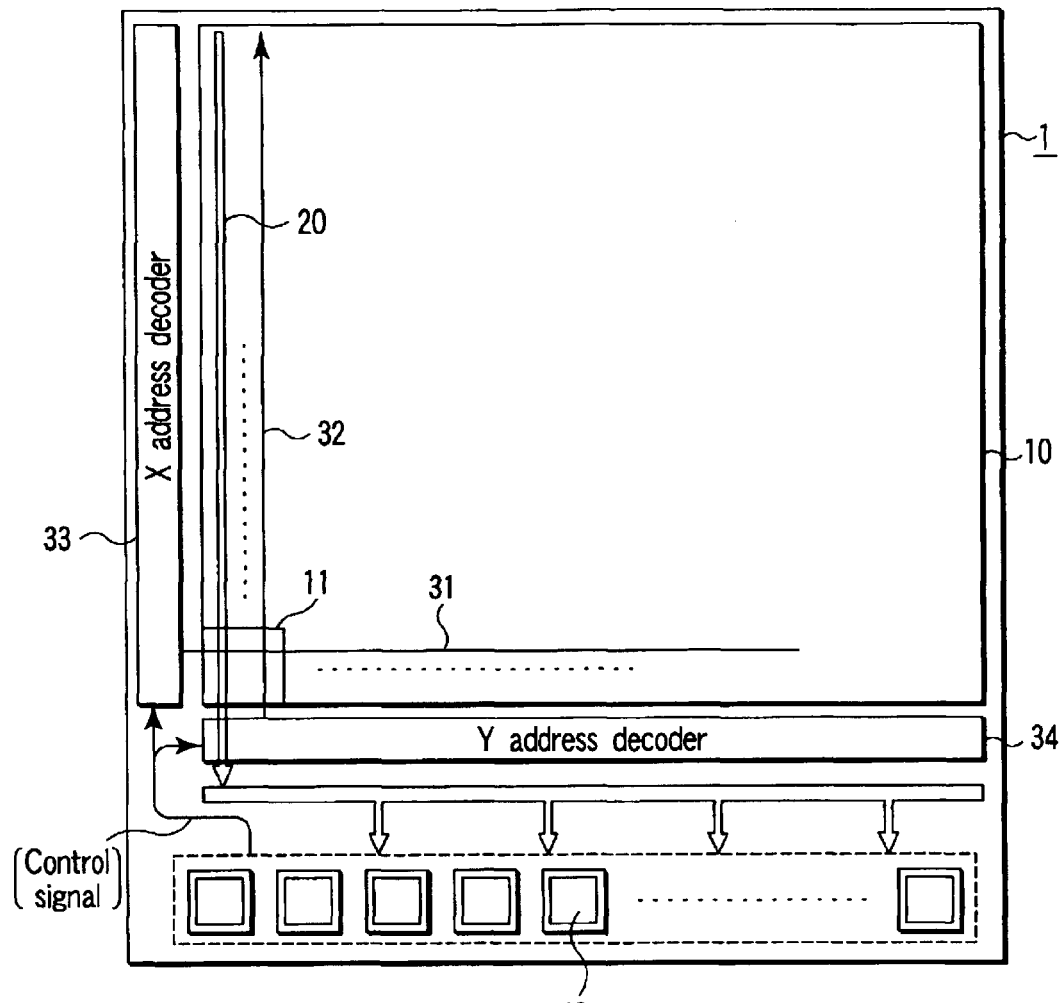
FIG. 1 is a plan view showing a constitutional example of an element characteristic/circuit characteristic evaluation apparatus according to an embodiment of the present invention.

FIG. 1 shows a configuration example of an element characteristic/circuit characteristic evaluation apparatus in accordance with one embodiment of the present invention. In FIG. 1, a unit array 10 is provided on an evaluation chip 1. The unit array 10 comprises 196 basic measurement units (MAU=Measurement Array Unit) 11 as measurement units, which are arranged in a lattice-like form by 14×14, for example. On the unit array 10, measurement buses (bus group for measurement) 20 and a plurality of X address selection signal lines 31 and a plurality of Y address selection signal lines 32 are arranged. The measurement buses 20, the plurality of X address selection signal lines 31 and the plurality of Y address selection signal lines 32 are each connected to the corresponding basic measurement units 11.

An X address decoder (control circuit) 33 is disposed at an outer peripheral portion of the chip 1, for example, on a left side of the unit array 10. A Y address decoder (control circuit) 34 is disposed on a lower side of the unit array 10. These decoders 33, 34 output an X address selection signal and a Y address selection signal based on a control signal supplied from the external of the evaluation chip 1, respectively. More specifically, the X address selection signal output from the decoder 33 is supplied to the corresponding basic measurement units 11, for example, via the X address selection signal lines 31. Further, the Y address selection signal output from the decoder 34 is supplied to the corresponding basic measurement units 11, for example, via the Y address selection signal lines 32.

A plurality of measurement terminal pads (measurement pads) 40 is arrayed on a lower side of the Y address decoder 34. The X address decoder 33, Y address decoder 34, and measurement bus 20 are each connected to the measurement terminal pads 40. Further, a measurement equipment (not shown) is connected to each measurement terminal pad 40, thus inputting the control signals and outputting measurement data from each of the basic measurement units 11.

Figure 2:
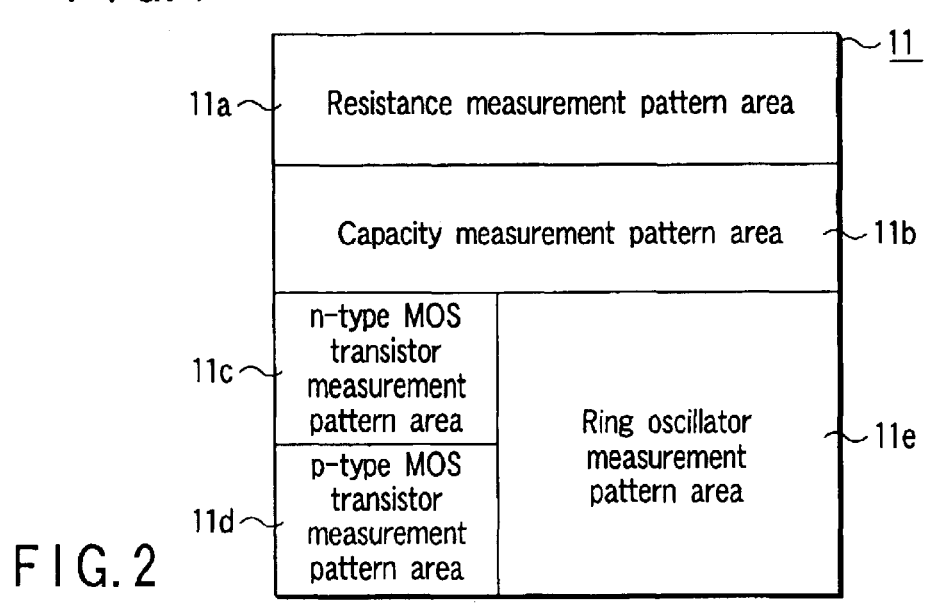
FIG. 2 is a view showing an example of a basic measurement unit in the element characteristic/circuit characteristic evaluation apparatus of FIG. 1.

FIG. 2 shows one configuration example of the basic measurement unit 11. The basic measurement unit 11 is divided into, for example, five areas 11a, 11b, 11c, 11d and 11e. Each of the areas 11a, 11b, 11c, 11d and 11e is equipped with several tens of measured patterns, which are different in kinds such as configuration, size and shape, of components (semiconductor elements or integrated circuits and delay circuits including semiconductor elements) that compose an LSI. More specifically, the area 11a is, for example, a resistance measurement pattern area, and this area is equipped with a resistive element which is one of the components, or several tens of patterns of resistance measurement circuits (measured patterns) including the resistive element. The area 11b is, for example, a capacity measurement pattern area, and this area is equipped with a capacity element which is one of the components, or several tens of patterns of capacity measurement circuits (measured patterns) including capacity element. The area 11c is, for example, an n-type MOS transistor measurement pattern area, and this area is equipped with an n-type MOS transistor which is one of the components, or several tens of patterns of n-type MOS transistor measurement circuits (measured patterns) including the n-type MOS transistor. The area 11d is, for example, a p-type MOS transistor measurement pattern area, and this area is equipped with a p-type MOS transistor which is one of the components, or several tens of patterns of p-type MOS transistor measurement circuits (measured patterns) including the p-type MOS transistor. The area 11e is, for example, a ring oscillator measurement pattern area, and this area is equipped with several tens of patterns of ring oscillator measurement circuits (measured patterns) in which the delay circuits, which are one of the components, have different delay times.

Here, the basic measurement unit 11 is configured with a size of about several hundred μm square, for example. Therefore, each of the areas 11a, 11b, 11c, 11d and 11e can be equipped with several tens or more (several tens of kinds to several hundreds of kinds) of measured patterns therein.

Figure 3:
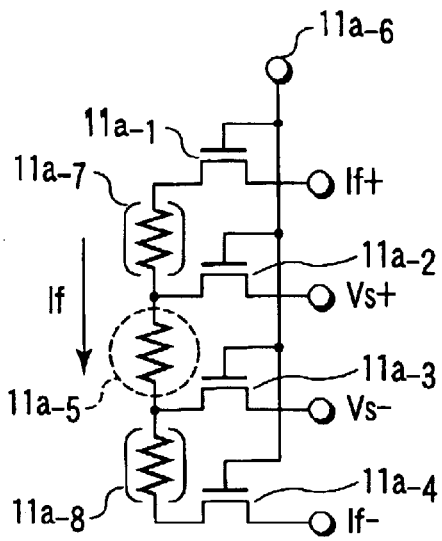
FIG. 3 is a view showing a constitutional example of a resistance measurement circuit in the element characteristic/circuit characteristic evaluation apparatus of FIG. 1.

FIG. 3 shows a configuration example of the resistance measurement circuit installed in the resistance measurement pattern area. This resistance measurement circuit is configured with four n-type MOS transistors $11a_{-1}$, $11a_{-2}$, $11a_{-3}$, $11a_{-4}$, and a measured element $11a_{-5}$ comprising one resistive element, for example. Gates of the n-type MOS transistors $11a_{-1}$, $11a_{-2}$, $11a_{-3}$, $11a_{-4}$ are each connected to a control terminal $11a_{-6}$. Drains of the n-type MOS transistors $11a_{-1}$, $11a_{-2}$, $11a_{-3}$, $11a_{-4}$ are connected to a measurement terminal If+, a measurement terminal Vs+, a measurement terminal Vs−, and a measurement terminal If−, respectively. Sources of the n-type MOS transistors $11a_{-1}$, $11a_{-2}$, $11a_{-3}$, $11a_{-4}$ are connected in common. The measured element $11a_{-5}$ is connected between the sources of the n-type MOS transistors $11a_{-2}$, $11a_{-3}$. In addition, a parasitic resistance $11a_{-7}$ is connected between the sources of the n-type MOS transistors $11a_{-1}$, $11a_{-2}$, and a parasitic resistance $11a_{-8}$ is connected between the sources of the n-type MOS transistors $11a_{-3}$, $11a_{-4}$.

In this resistance measurement circuit, a measurement current If is applied across the measurement terminals If+, If−, thereby measuring a potential difference between the measurement terminals Vs+, Vs−. If the potential difference is Vs, a resistance value R of the measured element $11a_{-5}$ is expressed by the following equation (1).

$$R=Vs/If \qquad (1)$$

Figure 4A:
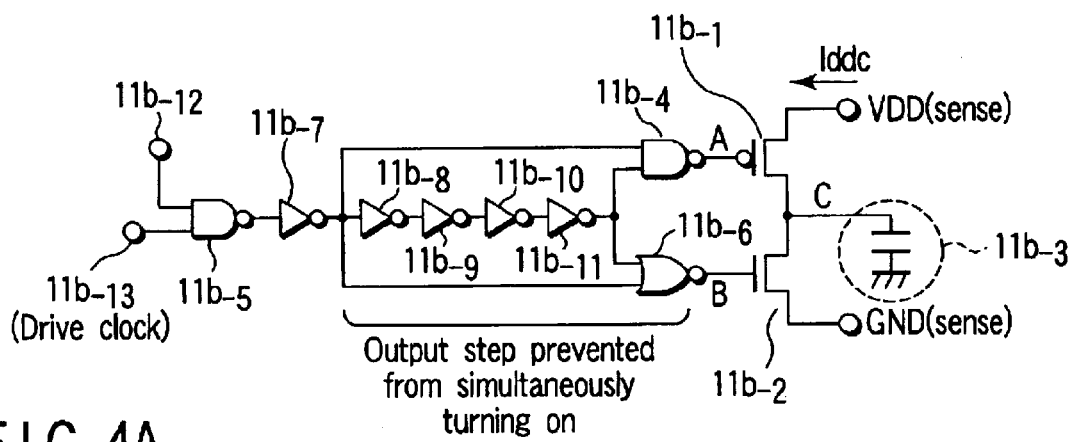
FIG. 4A is a view showing a constitutional example of a capacity measurement circuit in the element characteristic/circuit characteristic evaluation apparatus of FIG. 1.
Figure 4B:
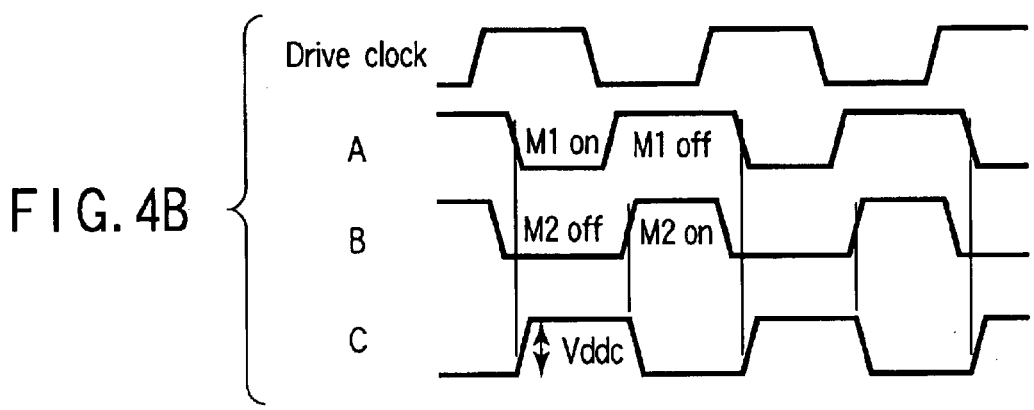
FIG. 4B is a view showing an example of an operation waveform of the capacity measurement circuit.

FIGS. 4A and 4B show one example of the capacity measurement circuit installed in the capacity measurement pattern area. Here, a capacity measurement circuit is taken as an example, which is configured by a CBCM (Charge-based Capacitance Measurement) method (e.g., refer to "James C. Chen, Dennis Sylvester, Chenming Hu, Hitoshi Aoki, Sam Nakagawa, Soo-Young Oh, "An On-Chip, Interconnect Capacitance Characterization Method with Sub-Femto-Fared Resolution," Proc. IEEE 1997 Int. Conference on Microelectronic Test Structures, vol. 10, pp. 77–80, March 1997.").

As shown in FIG. 4A, for example, this capacity measurement circuit is configured with a p-type MOS transistor (M1) $11b_{-1}$ and an n-type MOS transistor (M2) $11b_{-2}$ that constitute a CMOS inverter, a measured element $11b_{-3}$ comprising a capacity element, a NAND circuits $11b_{-4}$, $11b_{-5}$, a NOR circuit $11b_{-6}$, and inverter circuits $11b_{-7}$, $11b_{-8}$, $11b_{-9}$, $11b_{-10}$ and $11b_{-11}$. A source of the p-type MOS transistor $11b_{-1}$ is connected to a power source for capacity measurement VDD(sense) terminal, and a gate (terminal A) thereof is connected to an output terminal of the NAND circuit $11b_{-4}$. A source of the n-type MOS transistor $11b_{-2}$ is connected to a ground (GND(sense)) terminal, and a gate (terminal B) thereof is connected to an output terminal of the NOR circuit $11b_{-6}$. The measured element $11b_{-3}$ is connected between a common drain (terminal C) of the p-type MOS transistor $11b_{-1}$ and n-type MOS transistor $11b_{-2}$, and the ground. One input terminal of the NAND circuit $11b_{-5}$ is connected to a control terminal $11b_{-12}$, and the other input terminal $11b_{-13}$ is supplied with a drive clock. An output terminal of the NAND circuit $11b_{-5}$ is connected to an input terminal of the inverter circuit $11b_{-7}$. An output terminal of the inverter circuit $11b_{-7}$ is connected to one input terminal of the NAND circuit $11b_{-4}$ and one input terminal of the NOR circuit $11b_{-6}$. Also, the output terminal of the inverter circuit $11b_{-7}$ is connected to an input terminal of the inverter circuit $11b_{-8}$. An output terminal of the inverter circuit $11b_{-8}$ is connected to an input terminal of the inverter circuit $11b_{-9}$. An output terminal of the inverter circuit $11b_{-9}$ is connected to an input terminal of the inverter circuit $11b_{-10}$. An output terminal of the inverter circuit $11b_{-10}$ is connected to an input terminal of the inverter circuit $11b_{-11}$. An output terminal of the inverter circuit $11b_{-11}$ is connected to the other input terminal of the NAND circuit $11b_{-4}$ and the other input terminal of the NOR circuit $11b_{-6}$.

This capacity measurement circuit utilizes the fact that current consumed by the CMOS inverter becomes the product of a drive voltage, frequency and load capacity. As FIG. 4B shows operating waveforms, for example, potentials (waveforms) of the terminal A and terminal B are adjusted so that the p-type MOS transistor $11b_{-1}$ and n-type MOS transistor $11b_{-2}$ should not be turned on simultaneously. The measured element $11b_{-3}$ connected to the terminal C is driven by a potential difference Vddc between the power source for capacity measurement VDD(sense) and the ground (GND(sense)).

If a frequency of the drive clock is fc and an average current value of the power source for capacity measurement VDD(sense) is Iddc, a capacity value Cd of the measured element $11b_{-3}$ can be expressed by the following equation (2).

$$Cd=Iddc/(fc \cdot Vddc) \qquad (2)$$

Figure 5:
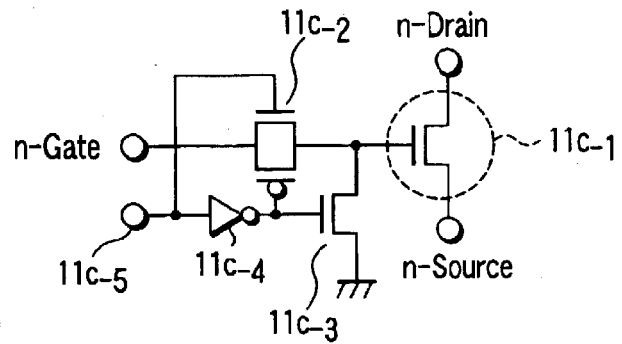
FIG. 5 is a view showing a constitutional example of an n-type MOS (metal oxide semiconductor) transistor measurement circuit in the element characteristic/circuit characteristic evaluation apparatus of FIG. 1.

FIG. 5 shows a configuration example of the n-type MOS transistor measurement circuit installed in the n-type MOS transistor measurement pattern area. In this n-type MOS transistor measurement circuit, for example, a gate of a measured element $11c_{-1}$ comprising an n-type MOS transistor is connected to a measurement terminal n-Gate via a transfer gate (switch circuit) $11c_{-2}$. A drain of the measured element $11c_{-1}$ is connected to a measurement terminal n-Drain, and a source thereof is connected to a measurement terminal n-Source. A drain of an n-type MOS transistor $11c_{-3}$ is connected to the gate of the measured element $11c_{-1}$. A source of the n-type MOS transistor $11c_{-3}$ is grounded, and a gate thereof is connected to a p-type MOS transistor side gate of the transfer gate $11c_{-2}$ and an output terminal of an inverter circuit $11c_{-4}$. A control terminal $11c_{-5}$ and an n-type MOS transistor side gate of the transfer gate $11c_{-2}$ are connected to an input terminal of the inverter circuit $11c_{-4}$.

In this n-type MOS transistor measurement circuit, a bias potential for characteristic measurement is applied across the measurement terminal n-Drain and measurement terminal n-Source. When the control terminal $11c_{-5}$ has a low potential, a gate potential of the measured element $11c_{-1}$ becomes a ground potential, and the n-type MOS transistor $11c_{-3}$ is turned off. When the control terminal $11c_{-5}$ has a high potential, a potential of the measurement terminal n-Gate is applied to the gate of the measured element $11c_{-1}$. As a result, the n-type MOS transistor $11c_{-3}$ is turned on, and the characteristic of the measured element $11c_{-1}$ can be measured.

Figure 6:
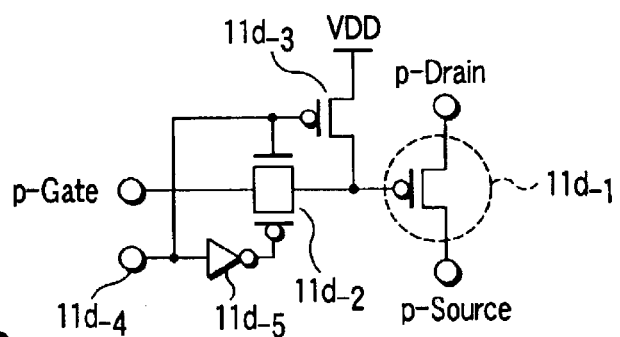
FIG. 6 is a view showing a constitutional example of a p-type MOS transistor measurement circuit in the element characteristic/circuit characteristic evaluation apparatus of FIG. 1.

FIG. 6 shows a configuration example of the p-type MOS transistor measurement circuit installed in the p-type MOS transistor measurement pattern area. In this p-type MOS transistor measurement circuit, for example, a gate of a measured element $11d_{-1}$ comprising a p-type MOS transistor is connected to a measurement terminal p-Gate via a transfer gate (switch circuit) $11d_{-2}$. A drain of the measured element $11d_{-1}$ is connected to a measurement terminal p-Drain, and a source thereof is connected to a measurement terminal n-Source. Also, a drain of a p-type MOS transistor $11d_{-3}$ is connected to the gate of the measured element $11d_{-1}$. A source of the p-type MOS transistor $11d_{-3}$ is connected to a power source VDD, and a gate thereof is connected to an n-type MOS transistor side gate of the transfer gate $11d_{-2}$ and a control terminal $11d_{-4}$. An input terminal of an inverter circuit $11d_{-5}$ is connected to the control terminal $11d_{-4}$. An output terminal of the inverter circuit $11d_{-5}$ is connected to a p-type MOS transistor side gate of the transfer gate $11d_{-2}$.

In this p-type MOS transistor measurement circuit, a bias potential for characteristic measurement is applied across the measurement terminal p-Drain and measurement terminal p-Source. When the control terminal $11d_{-4}$ has a low potential, a gate potential of the measured element $11d_{-1}$ becomes high, and the p-type MOS transistor $11d_{-3}$ is turned off. When the control terminal $11d_{-4}$ has a high potential, a potential of the measurement terminal p-Gate is applied to the gate of the measured element $11d_{-1}$. As a result, the p-type MOS transistor $11d_{-3}$ is turned on, and the characteristic of the measured element $11d_{-1}$ can be measured.

Figure 7:
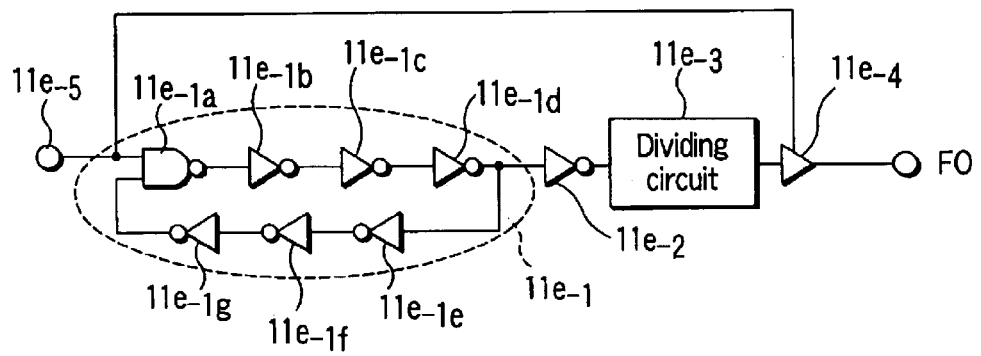
FIG. 7 is a view showing a constitutional example of a ring oscillator measurement circuit in the element characteristic/circuit characteristic evaluation apparatus of FIG. 1.

FIG. 7 shows a configuration example of the ring oscillator measurement circuit installed in the ring oscillator measurement pattern area. This ring oscillator measurement circuit is configured, for example, with a measured circuit $11e_{-1}$ comprising a ring oscillator section, an inverter circuit $11e_{-2}$, a dividing circuit $11e_{-3}$, and an output buffer (tristate buffer) $11e_{-4}$. The measured circuit $11e_{-1}$ has one NAND circuit $11e_{-1a}$ and six inverter circuits $11e_{-1b}$, $11e_{-1c}$, $11e_{-1d}$, $11e_{-1e}$, $11e_{-1f}$ and $11e_{-1g}$. A control terminal $11e_{-5}$ and the output buffer $11e_{-4}$ are connected to one input terminal of the NAND circuit $11e_{-1a}$. An output terminal of the NAND circuit $11e_{-1a}$ is connected to an input terminal of the inverter circuit $11e_{-1b}$. An output terminal of the inverter circuit $11e_{-1b}$ is connected to an input terminal of the inverter circuit $11e_{-1c}$. An output terminal of the inverter circuit $11e_{-1c}$ is connected to an input terminal of the inverter circuit $11e_{-1d}$. An output terminal of the inverter circuit $11e_{-1d}$ is connected to an input terminal of the inverter circuit $11e_{-1e}$ and an input terminal of the inverter circuit $11e_{-2}$. An output terminal of the inverter circuit $11e_{-1e}$ is connected to an input terminal of the inverter circuit $11e_{-1f}$. An output terminal of the inverter circuit $11e_{-1f}$ is connected to an input terminal of the inverter circuit $11e_{-1g}$. An output terminal of the inverter circuit $11e_{-1g}$ is connected to the other input terminal of the NAND circuit $11e_{-1a}$. An output terminal of the inverter circuit $11e_{-2}$ is connected to an input terminal of the output buffer $11e_{-4}$ via the dividing circuit $11e_{-3}$. An output terminal of the output buffer $11e_{-4}$ is connected to a measurement terminal F0.

In this ring oscillator measurement circuit, when the control terminal $11e_{-5}$ has a low potential, an output of the NAND circuit $11e_{-1a}$ in a first step is fixed to a high potential. Accordingly, the measured circuit (ring oscillator section) $11e_{-1}$ is brought in an oscillation-stopped state. At this moment, the tristate buffer $11e_{-4}$ in an output step brings a divided output of the measurement terminal F0 into a high impedance state because the control terminal $11e_{-5}$ has a low potential. If the control terminal $11e_{-5}$ has a high potential, the NAND circuit $11e_{-1a}$ in the first step outputs an inverted logical value of the other input (the other input terminal). In this way, the measured circuit $11e_{-1}$ oscillates. After properly divided by the dividing circuit $11e_{-3}$, this oscillation output is output from the measurement terminal F0. That is, when the control terminal $11e_{-5}$ has a high potential, the tristate buffer $11e_{-4}$ at the output becomes effective, and the oscillation output of the ring oscillator section ($11e_{-1}$) is divided and output from the measured terminal F0.

FIG. 8 to FIG. 11 show one example of the measurement bus 20. In the present embodiment, the measurement bus 20 is configured with a mesh measurement bus (second bus) 21 shown in FIG. 8, and straight measurement buses (first buses) 22, 23, and 24 respectively shown in FIG. 9 to FIG. 11.

Figure 8:
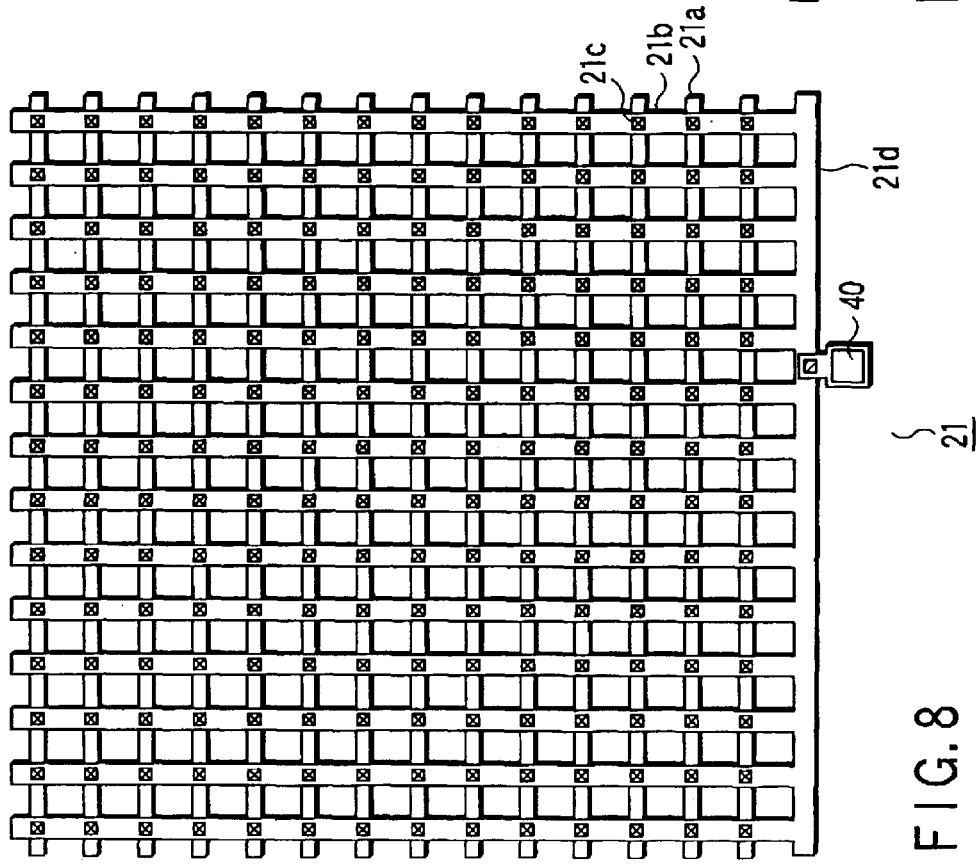
FIG. 8 is a view showing an example of a mesh measurement bus which constitutes a measurement bus in the element characteristic/circuit characteristic evaluation apparatus of FIG. 1.

The mesh measurement bus 21 has a mesh structure comprising a plurality of lateral wires (lateral buses) 21a and a plurality of vertical wires (vertical buses) 21b which is in a different layer from that of the lateral wires 21a, for example, as shown in FIG. 8. A space between the wires 21a and a space between the wires 21b almost correspond to a space between the arranged basic measurement units 11. At each intersection point, the wires 21a, 21b are interconnected by a via contact 21c. The wires 21a, 21b are connected to one of the measurement terminal pads 40 via a lateral wire 21d constituted in the same layer as that of the vertical wires 21b. With such a mesh structure, it is possible to form the mesh measurement bus 21 having low resistance in which all the buses can be fixed to the same potential.

In addition, plural sets of mesh measurement buses 21 are arranged in an upper layer of the basic measurement units 11 mentioned above, correspondingly to the total number of basic measurement units 11, for example (details will be described later).

Figure 9:
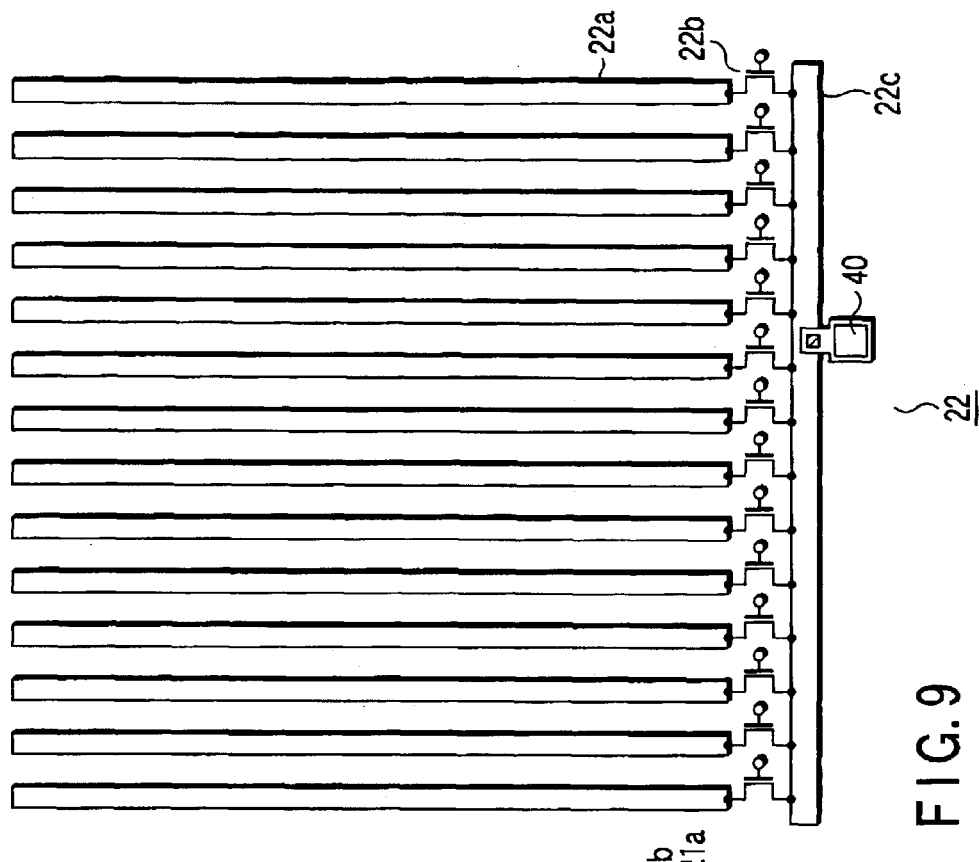
FIG. 9 is a view showing an example of a straight measurement bus which constitutes the measurement bus in the element characteristic/circuit characteristic evaluation apparatus of FIG. 1.

The straight measurement bus 22 has a stripe structure comprising a plurality of vertical wires (vertical buses) 22a which is in the same layer as that of the vertical wires 21b, for example, as shown in FIG. 9. More specifically, a predetermined number of wires 22a are each arranged in the spaces between the vertical wires 21b of the mesh measurement bus 21 (details will be described later). The wires 22a are connected to one of the measurement terminal pads 40 via a plurality of selection switches 22b comprising n-type MOS transistors and p-type MOS transistors, and a lateral wire 22c. Each of the selection switches 22b is controlled by a signal from the Y address selection signal lines 32, for example. That is, only parts of the plurality of selection switches 22b corresponding to measured items (resistance, capacity, transistor, delay circuit) in each basic measurement unit 11 are turned on, and the rest are turned off. Unnecessary measurement bus nets (measurement circuit systems) are shut off by turning on only the necessary parts of the selection switches 22b, thereby making it possible to prevent a leak current flow.

Figures 10, 11:
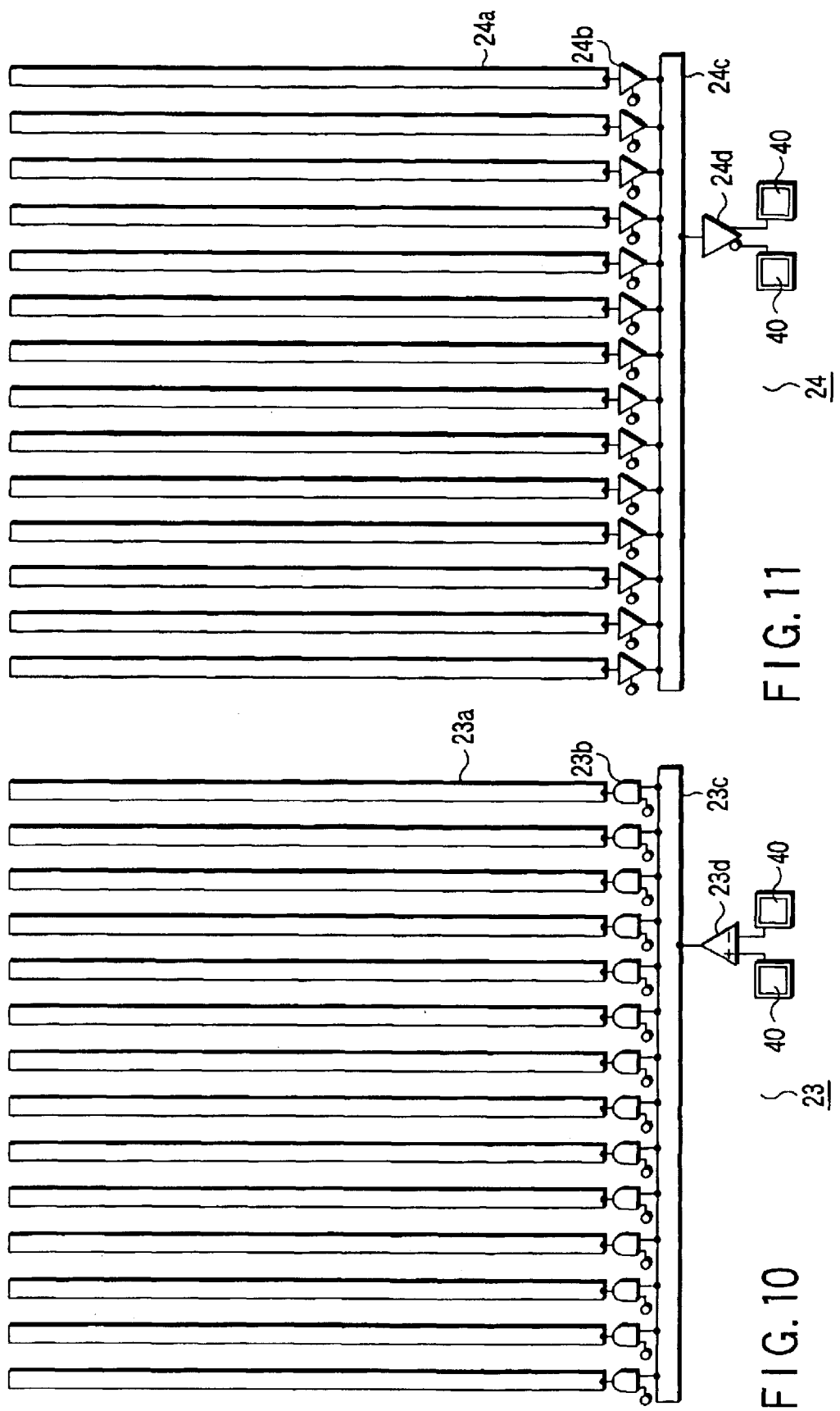
FIG. 10 is a view showing a constitutional example of a driving clock straight measurement bus of the capacity measurement circuit in the element characteristic/circuit characteristic evaluation apparatus of FIG. 1.
FIG. 11 is a view showing a straight measurement bus for the ring oscillator measurement circuit in the element characteristic/circuit characteristic evaluation apparatus of FIG. 1.

The straight measurement bus (for capacity measurement drive clock) 23 has a stripe structure comprising a plurality of vertical wires (vertical buses) 23a which is in the same layer as that of the vertical wires 21b, for example, as shown in FIG. 10. More specifically, a predetermined number of wires 23a are each arranged in the spaces between the vertical wires 21b of the mesh measurement bus 21 (details will be described later). The wires 23a are connected to two of the measurement terminal pads 40 via a plurality of measurement bus selection gates (selection switches) 23b, a lateral wire 23c and a differential clock buffer 23d. Each of the measurement bus selection gates 23b is controlled by a signal from the Y address selection signal lines 32, for example. That is, a drive clock is supplied to only necessary parts of the vertical wires 23a by means of the plurality of measurement bus selection gates 23b. In this way, it is possible to prevent unnecessary current consumption and noise occurrence.

The straight measurement bus 24 is a measurement bus for measuring ring oscillators, and has a stripe structure comprising a plurality of vertical wires (vertical buses) 24a which is in the same layer as that of the vertical wires 21b, for example, as shown in FIG. 11. More specifically, a predetermined number of wires 24a are each arranged in the spaces between the vertical wires 21b of the mesh measurement bus 21 (details will be described later). The wires 24a are connected to two of the measurement terminal pads 40 via a plurality of measurement bus selection gates (selection switches) 24b, a lateral wire 24c and a differential output buffer 24d. Each of the measurement bus selection gates 24b is controlled by a signal from the Y address selection signal lines 32, for example. That is, only necessary parts of the vertical wires 24a are made effective by the plurality of measurement bus selection gates 24b. In this way, it is possible to prevent unnecessary current consumption and noise occurrence.

Here, connection relationships (measurement bus nets) of the resistance measurement circuit, capacity measurement circuit, n-type MOS transistor measurement circuit, p-type MOS transistor measurement circuit and ring oscillator measurement circuit with the measurement bus 20 will be described.

In the resistance measurement circuit (see FIG. 3), the measurement terminals If+, If−, Vs+, Vs− are each connected to the vertical wires 22a of the straight measurement bus 22 shown in FIG. 9, thereby configuring a desired measurement bus net. In this case, n-type MOS transistors are used for the selection switches 22b. A logic (not shown) which takes the logical product of the X address selection signal lines 31 and Y address selection signal lines 32 is connected to the control terminal $11a_{-6}$. In addition, the measurement terminal If− can also be connected to the mesh measurement bus 21 shown in FIG. 8. In that case, the selection switch (transistor $11a_{-4}$) linked to the measurement terminal If− may be omitted.

In the capacity measurement circuit (see FIG. 4A), the terminal of the power source for capacity measurement VDD(sense) is connected to the vertical wires 22a of the straight measurement bus 22 shown in FIG. 9 (in this case, p-type MOS transistors are used for the selection switches 22b). The input terminal $11b_{-13}$ of the NAND circuit $11b_{-5}$ is connected to the vertical wires 23a of the straight measurement bus 23 shown in FIG. 10. Further, the ground (GND(sense)) terminal is connected to one of the plural sets of mesh measurement buses (see FIG. 8) 21, thereby configuring a desired measurement bus net. Moreover, a logic (not shown) which takes the logical product of the X address selection signal lines 31 and Y address selection signal lines 32 is connected to the control terminal $11b_{-12}$. In this way, the drive clock of the capacity measurement circuit is supplied from the vertical wires 23a of the straight measurement bus 23. As a result, the measurement current to which capacity-current conversion has been applied by the CBCM method is output via the vertical wires 22a of the straight measurement bus 22.

In the n-type MOS transistor measurement circuit (see FIG. 5), the measurement terminals n-Drain, n-Source, n-Gate are each connected to the plural sets of mesh measurement buses (see FIG. 8) 21, thereby configuring a desired measurement bus net. A logic (not shown) which takes the logical product of the X address selection signal lines 31 and Y address selection signal lines 32 is connected to the control terminal $11c_{-5}$. In this n-type MOS transistor measurement circuit, a potential drop during measurement can be restricted by using the mesh measurement buses 21, thereby enabling highly accurate measurement.

In the p-type MOS transistor measurement circuit (see FIG. 6), the measurement terminals p-Drain, p-Source, p-Gate are each connected to the plural sets of mesh measurement buses (see FIG. 8) 21, thereby configuring a desired measurement bus net. A logic (not shown) which takes the logical product of the X address selection signal lines 31 and Y address selection signal lines 32 is connected to the control terminal $11d_{-4}$. In this p-type MOS transistor measurement circuit, a potential drop during measurement can be restricted by using the mesh measurement buses 21, thereby enabling highly accurate measurement.

In the ring oscillator measurement circuit (see FIG. 7), the measurement terminal F0 is connected to the vertical wires 24a of the straight measurement bus 24 shown in FIG. 11, thereby configuring a desired measurement bus net. A logic (not shown) which takes the logical product of the X address selection signal lines 31 and Y address selection signal lines 32 is connected to the control terminal $11e_{-5}$.

In the present embodiment, seven sets of mesh measurement buses 21, five vertical wires 22a, one vertical wire 23a and one the vertical wire 24a are allocated to one basic measurement unit 11, for example. That is, if the number of basic measurement units 11 is "196 (=14×14)", the measurement bus 20 is constituted by seven sets of mesh measurement buses 21, the straight measurement bus 22 having 70 (=14×5) vertical wires 22a, the straight measurement bus 23 having 14 vertical wires 23a, and the straight measurement bus 24 having 14 vertical wires 24a.

In addition, the measurement bus 20 is designed to have the optimum configuration and optimum bias conditions in accordance with the characteristics of the measured elements $11a_{-5}$, $11b_{-3}$, $11c_{-1}$, $11d_{-1}$, and the characteristics of the measured circuit $11e_{-1}$. That is, by selecting the proper configuration of the measurement bus 20 and optimum bias conditions for each measurement circuit correspondingly to the characteristics of the circuit, it is possible to avoid error factors that affect the measurement such as the leak current of the selection switches and potential drop caused by the parasitic resistance of the measurement bus 20.

Furthermore, regardless of the kind of measurement circuit, the X, Y address decoders 33, 34 on the evaluation chip 1, a power source (not shown) and the like are shared.

Still further, functions of the X, Y address decoders 33, 34 include, for example, mode setting of the measurement circuits and monitoring of internal operation in addition to addressing, which are not described in detail though.

In the element characteristic/circuit characteristic evaluation apparatus with such a configuration, measurement equipment is connected to the measurement terminal pads 40. Further, control signals, and power source and measurement biases corresponding to the measurement items and the like are input via the measurement terminal pads 40. Then, in accordance with the control signals, the measurement bus 20 is selectively connected to the measurement terminal pads 40, and one of the resistance measurement circuit, capacity measurement circuit, n-type MOS transistor measurement circuit, p-type MOS transistor measurement circuit or ring oscillator measurement circuit in the basic measurement unit 11 connected to the measurement bus 20 is put under a controlled state. In this way, the connection of the measurement bus net, which corresponds to the measurement item, to the measurement terminal pads 40 is electrically switched, thereby outputting an output (measurement data) of the circuit put in the controlled state to the measurement equipment from the measurement terminal pads 40 via the measurement bus 20.

As described above, several hundreds of basic measurement units with a size of several hundred $\mu$m square are arranged on the same chip in a lattice-like form. The basic measurement units are equipped with several tens to several hundreds of variations of measurement circuits with different configurations and sizes of element resistance (parasitic resistance) that decides the delay time, capacity (parasitic capacity), transistors and the like, and equipped with several tens to several hundreds of measurement circuits that are differ in sample circuits capable of evaluating the delay time of the ring oscillator and the like. These measurement circuits are components (measured elements or measured circuits) of an LSI. In this case, the number of measurement circuits mounted on one basic measurement unit amounts to several hundred in total, while the number of measured patterns per chip amounts to several tens of thousands to several hundred thousands.

Furthermore, the measurement bus provided with the selection switches is suitably connected to each basic measurement unit, so as to constitute a measurement bus net between the measurement bus and the measurement circuit. The connection of this measurement bus net with the measurement terminal pads is electrically switched by controlling the selection switches on the basis of the control signal.

In this way, it is possible to obtain the measurement data on measured patterns of several tens of thousands to several hundred thousands per chip by electrically enabling the selection of the measured patterns without mechanically moving the evaluation chip. Especially, since all the measured patterns are put together in the basic measurement unit of several hundred $\mu$m square, it is possible to accurately evaluate the correlation of a fluctuation of characteristics among the measured patterns individually. Moreover, in this method, while the selection of the measured patterns is electrically switched, constitution of the measurement buses and bias application method can be optimized in accordance with the measurement items, thereby enabling required measurement accuracy to be ensured.

For example, when the size of one basic measurement unit is 250 $\mu$m square, a chip of 3.5 $\mu$m square can be broken into 196 ($14^2$) for evaluation. In this way, sufficient spatial resolution can be secured for a normal LSI chip size (several mm squares to ten mm square or so). Moreover, 196 samples can be obtained per chip, which enables accurate statistical evaluation.

More specifically, the use of the method in accordance with the present embodiment makes it possible to solve the following problems posed in the conventional method.

(1) Per chip, several tens of thousands to several hundred thousands measured patterns can be evaluated. As a result, an about double-digit improvement can be accomplished in the production cost of the chip in relation to an amount of data that can be collected.

(2) The measurement terminal pads can be arranged only in the vicinity of an outer periphery of the chip. That is, the measured elements and measurement circuits can be arranged with high density in the basic measurement unit. This provides a layout quite similar to that of the normal LSI, so that it is possible to collect measurement data reflecting a characteristic fluctuation of the elements in the actual LSI.

(3) The elements are individually measured by electrically switching the connection. In that case, one chip is mechanically moved to contact a certain measured element only one time. As a result, a common effect of the parasitic resistance is made on the individual measured patterns, which makes it possible to accurately evaluate a characteristic fluctuation of the elements in the chip. Further, since the number of mechanical contacts is decreased, the entire measurement time is barely increased even if a measurement sequence is introduced to check contact resistance. As a result, it is possible to easily ensure stability in the contact resistance and accurately evaluate the characteristic fluctuation of the elements in the chips.

(4) The basic measurement units of several hundred $\mu$m square are arranged in a lattice-like form, thereby allowing several hundreds of measurement data on the same measured element to be obtained per chip. This enables highly accurate statistical evaluation with one chip, and also enables correlation between elements to be analyzed per chip.

(5) Since all the measured patterns are put together in the basic measurement unit of several hundred $\mu$m square, the layout is quite similar to that of the normal LSI, and it is possible to evaluate, with a high degree of reliability, not only the correlation of a characteristic fluctuation among the elements but also the correlation of a delay time fluctuation among circuits with the characteristic fluctuation.

Next, another embodiment in accordance with the present invention will be described.

FIG. 12 shows another configuration example of the n-type MOS transistor measurement circuit. In the n-type MOS transistor measurement circuit (see FIG. 5), all the measured elements $11c\text{-}_1$ in the area are connected to the mesh measurement bus 21. Therefore, an off-leak of the n-type MOS transistor has a significant influence on the measurement accuracy. In order to restrict the off-leak of the n-type MOS transistor, an off-bias potential GNDE is connected to a source of an n-type MOS transistor $11c\text{-}_3'$, for example, as shown in FIG. 12. In this way, the off-bias potential GNDE is applied as a gate potential of the measured element $11c\text{-}_1$ when it is not selected. As a result, it is possible to reduce the leak current flowing across the measurement terminals n-Drain, n-Source, and improve the measurement accuracy.

FIG. 13 shows another configuration example of the p-type MOS transistor measurement circuit. In this p-type MOS transistor measurement circuit, an off-bias potential VDDE is connected to a source of a p-type MOS transistor $11d\text{-}_3'$, for example. In this way, the off-bias potential VDDE is applied as a gate potential of the measured element $11d\text{-}_1$ when it is not selected. This reduces an off-leak of the p-type MOS transistor. As a result, it is possible to reduce the leak current flowing across the measurement terminals p-Drain, p-Source, and improve the measurement accuracy, as in the n-type MOS transistor measurement circuit shown in FIG. 12.

FIG. 14 shows another configuration example of the mesh measurement bus shown in FIG. 8. A mesh measurement bus (second bus) 21A in this example is divided into four divisional buses (groups) 21B, for example. By being divided, this mesh measurement bus 21A can reduce the parasitic resistance and leak current (off-leak current from the measured element flowing into each of the divisional buses 21B). Especially, the mesh measurement bus 21A can be used to measure transistors, so that the measurement accuracy of on-current is improved.

Figure 15:
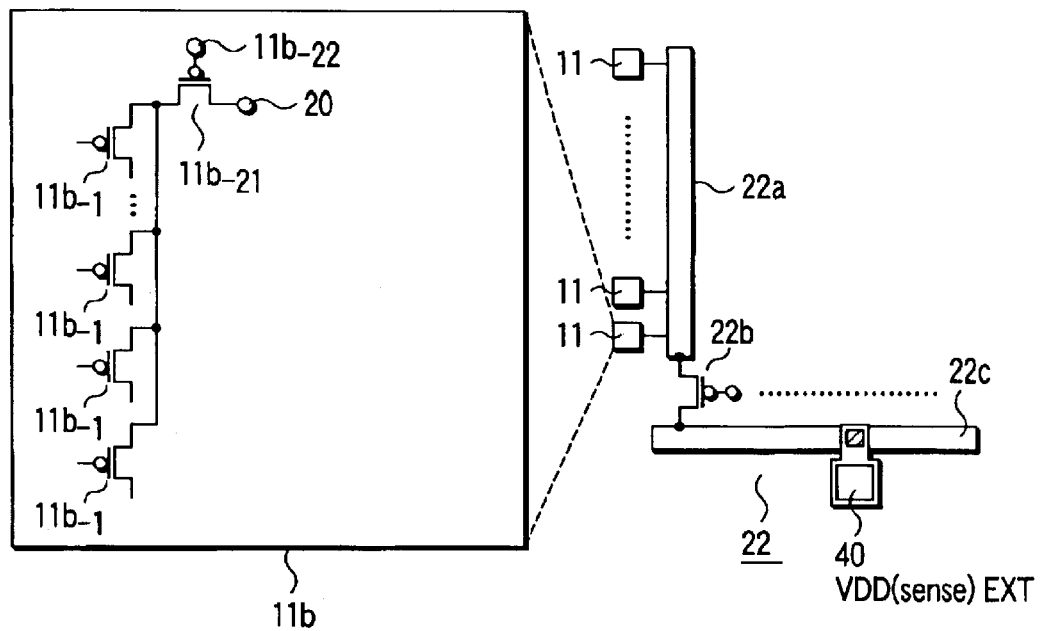
FIG. 15 is a view showing another constitutional example (measurement bus net) of a capacity measurement circuit.

FIG. 15 shows another configuration example of the capacity measurement circuit (measurement bus net). In this example, a selection switch (selection circuit) $11b_{-21}$ comprising a p-type MOS transistor is connected in common to the p-type MOS transistors $11b_{-1}$ of all the capacity measurement circuits (see FIG. 4A) in the capacity measurement pattern area $11b$ in each basic measurement unit 11. A gate of the selection switch $11b_{-21}$ is connected to a control terminal $11b_{-22}$. In each basic measurement unit 11, all the capacity measurement circuits are connected to the vertical wires $22a$ of the straight measurement bus 22 via the selection switch $11b_{-21}$, thereby configuring a measurement bus net for capacity measurement. In this way, it is possible to shut off leak currents from more unnecessary circuits (off-leak of the transistors $11b_{-1}$) and improve the measurement accuracy.

Figure 16:
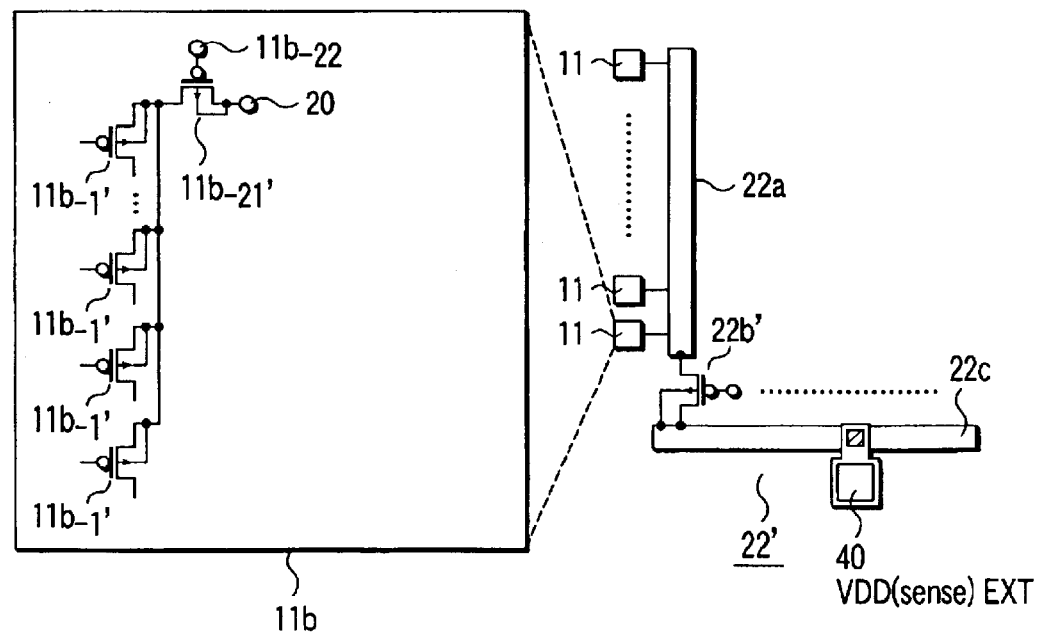
FIG. 16 is a view showing yet another constitutional example (measurement bus net) of a capacity measurement circuit.

FIG. 16 shows still another configuration example of the measurement bus net for capacity measurement. Normally, in a CMOS circuit, a power source potential is applied to a well of the p-type MOS transistor. In the measurement bus net shown in FIG. 15, the measurement terminal pads 40 to which a power source VDD(sense) EXT is applied can be regarded as a power source terminal. Therefore, the well is fixed by the potential of the measurement terminal pads 40. Consequently, the leak current to flow into the selection switches (well of the p-type MOS transistor) $22b$ then flows into the measurement terminal pads 40, which could cause measurement errors. To prevent this, in the measurement bus net in this example, the wells are connected to the sources in selection switches $22b'$, $11b_{-21}'$, and the p-type MOS transistors $11b_{-1}'$ of all the capacity measurement circuit, for example, as shown in FIG. 16. As a result, it is possible to shut off unnecessary leak current components flowing into the wells.

Figure 17:
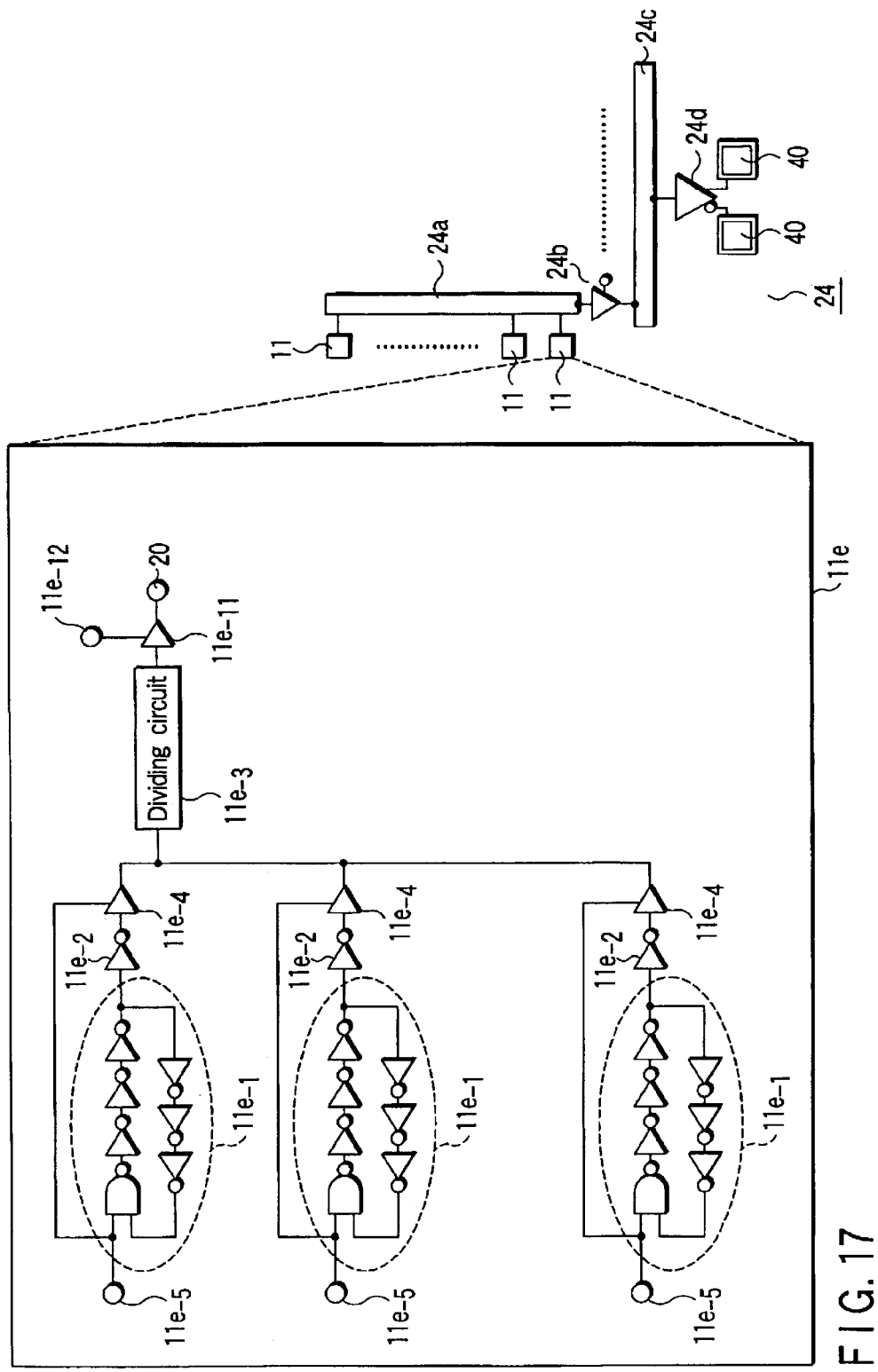
FIG. 17 is a view showing yet another constitutional example (measurement bus net) of a ring oscillator measurement circuit.

FIG. 17 shows another configuration example of the measurement bus net for ring oscillator measurement. In this example, all the ring oscillator measurement circuits (see FIG. 7) in the ring oscillator measurement pattern area $11e$ in each basic measurement unit 11 are constituted to share the dividing circuit $11e_{-3}$. Further, in each basic measurement unit 11, all the ring oscillator measurement circuits are connected to the measurement bus 20 via a selection gate $11e_{-11}$, thereby configuring a measurement bus net for ring oscillator measurement. In addition, a control terminal $11e_{-12}$ is connected to the selection gate $11e_{-11}$.

Figure 18A:
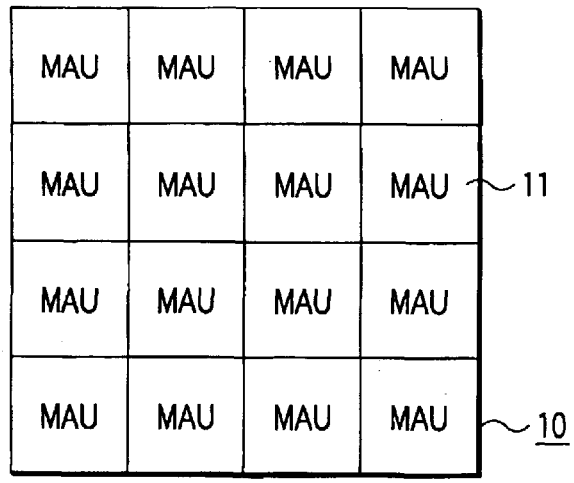
FIGS. 18A to 18C are plan views showing constitutional examples of unit arrays in the element characteristic/circuit characteristic evaluation apparatus of FIG. 1.
Figure 18B:
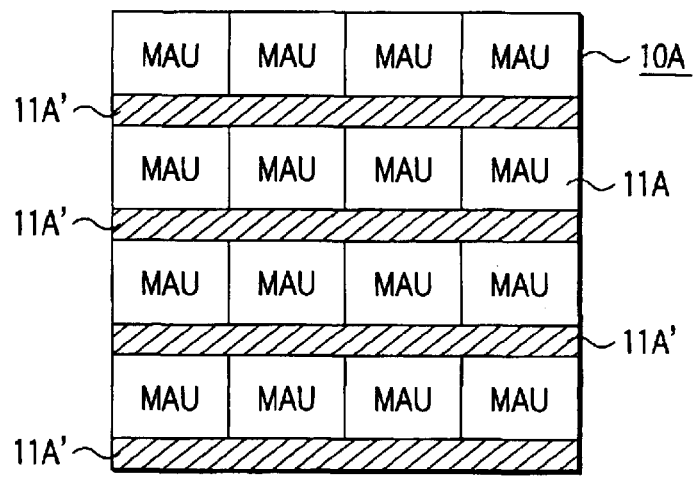
Figure 18C:
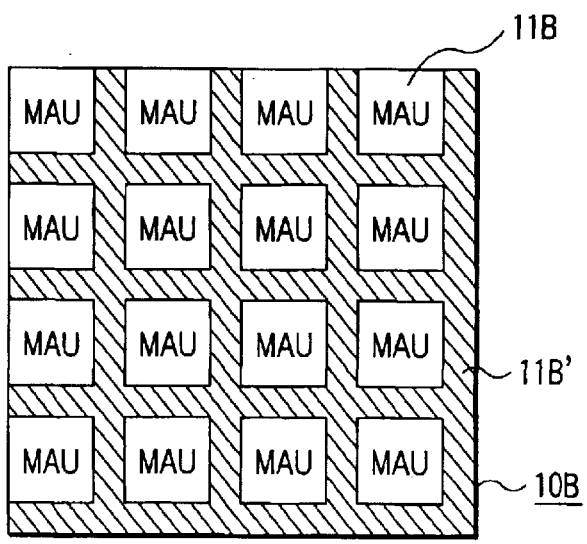

FIGS. 18A to 18C show other configuration examples of the unit array. In addition, FIG. 18A shows a basic arrangement of the basic measurement units 11 in the unit array 10 shown in the embodiment described above, and here shows an example of a 4×4 arrangement of the basic measurement units 11. FIG. 18B shows an example of a 4×4 arrangement of the basic measurement units in which a common portion is provided for each 4×1 (n alignments (n >1)) alignment, and FIG. 18C shows an example of a 4×4 arrangement of the basic measurement units in which a common portion is provided for 4×4 (n alignments (n >1)) alignments.

More specifically, when only a particular measurement pattern area needs a relatively large area, common portions 11A' are arranged which step over plural sets (here, n=4) of basic measurement units 11A to provide common parts in the area, for example, as shown in FIG. 18B. This makes it possible to hold an excessive increase of the area in the case of a unit array 10A. In addition, the common portions 11A' may all be the same measurement pattern area, or can be different measurement pattern areas.

Furthermore, as shown in FIG. 18C, for example, it is also possible to arrange a common portion 11B' in the spaces among a plurality (here, n=16) of basic measurement units 11B. A unit array 10B with such a configuration is especially effective when it is necessary to arrange vertical long wires and lateral long wires in the measurement pattern area.

FIGS. 19A to 19C show examples in which lowered-capacity wires, and lowered-capacity and lowered-resistance wires are used to improve capacity measurement accuracy. In addition, FIG. 19A shows a common wiring structure comprising five layers of laminated wires (first wire layer to fifth wire layer), FIG. 19B shows one example of a lowered-capacity wiring structure in which target wires have lowered capacity, and FIG. 19C shows one example of a lowered-capacity and lowered-resistance wiring structure in which target wires have lowered capacity and lowered resistance.

Here, in the case of the capacity measurement circuit composed by the CBCM method (see FIG. 4A), a measurement current flowing through the measured element $11b_{-3}$ changes in proportion to a frequency of the drive clock. The higher the measurement current is, the less a leak current causes an error. That is, the higher the frequency of the drive clock is, the more the measurement accuracy is improved. However, if higher speed is enabled in the straight measurement bus 23 for the drive clock shown in FIG. 10, noise produced on the chip 1 is increased.

Furthermore, as shown in FIG. 15, the parasitic capacity and parasitic resistance of the straight measurement bus 22 restricts response of the capacity measurement circuit. Therefore, the measurement bus net needs to have lowered-capacity and lowered-resistance in order to achieve accurate measurement at high frequency.

In the lowered-capacity wires shown in FIG. 19B, for example, among first, second, third wire layers $22_{-1}$, $22_{-2}$, $22_{-3}$ constituted by small pitch wires, and fourth, fifth wire layers $22_{-4}$, $22_{-5}$ constituted by large pitch wires, a target wire $22x$ constituted by the third wire layer $22_{-3}$ has lowered capacity. Taking a copper (Cu) wiring process of a 0.13 µm generation as an example, the parasitic capacity of the target wire $22x$ is 0.1 pF/mm, which is about half of a parasitic capacity of the general third wire layer $22_{-3}$ of 0.2 pF/mm. That is, by using the lowered-capacity wires having a wiring structure of this kind as the straight measurement bus for the drive clock in the capacity measurement circuit, the noise produced on the chip 1 can be reduced by half, as compared with the case where the general wires (see FIG. 19A) are used.

In the lowered-capacity and lowered-resistance wires shown in FIG. 19C, for example, among the first, second, third wire layers $22_{-1}$, $22_{-2}$, $22_{-3}$ constituted by the small pitch wires, and the fourth, fifth wire layers $22_{-4}$, $22_{-5}$ constituted by the large pitch wires, a target wire $22y$ constituted by the fourth wire layer $22_{-4}$ has lowered capacity and lowered resistance. Taking the Cu wiring process of the 0.13 μm generation as an example, the parasitic capacity of the target wire 22y is 0.12 pF/mm, which is about half of a parasitic capacity of the general fourth wire layer $22\text{-}_4$ of 0.24 pF/mm. Further, a wiring resistance is 50 Ω/mm, which is about half of a wiring resistance of the general fourth wire layer $22\text{-}_4$ of 100 Ω/mm. That is, by using the lowered-capacity and lowered-resistance wires having a wiring structure of this kind as the straight measurement bus for the outputting measurement currents in the capacity measurement circuit, it is possible to reduce the noise on the chip 1 and secure high-speed response when the drive clock is speeded up. The response can be about four times as fast as that in the case where the general wires (see FIG. 19A) are used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor characteristic evaluation apparatus comprising:
   a plurality of measurement units arranged on a chip, on which a plurality of measured patterns of components configuring a semiconductor integrated circuit and varying in kind from component to component are mounted;
   a measurement bus group arranged above the plurality of measurement units and connected to the plurality of measured patterns to configure a measurement circuit system in accordance with measured items of the components;
   a plurality of measurement pads, on the chip, which are arranged in a region other than an arrangement region of the plurality of measurement units and to which a measuring device is connected;
   a plurality of selection switches which select, in accordance with the measured items of the components, a measurement bus group configuring the measurement circuit system in accordance with the measured items and which connect the group to the plurality of measurement pads; and
   a control circuit which electrically controls switching of the plurality of selection switches in accordance with the measured items of the components.

2. The semiconductor characteristic evaluation apparatus according to claim 1, wherein each component configuring the semiconductor integrated circuit is a semiconductor element or an integrated circuit including a semiconductor element, and the plurality of measured patterns are formed by a plurality of semiconductor elements or a plurality of integrated circuits different from one another in structure, size and shape.

3. The semiconductor characteristic evaluation apparatus according to claim 1, wherein one of the components configuring the semiconductor integrated circuit is a delay circuit, and the plurality of measured patterns are formed by a plurality of delay circuits different from one another in delay time.

4. The semiconductor characteristic evaluation apparatus according to claim 1, wherein several tens or several hundreds of kinds of measured patterns are mounted on each of the plurality of measurement units.

5. The semiconductor characteristic evaluation apparatus according to claim 1, wherein each of the plurality of measurement units comprises a plurality of areas in which the plurality of measured patterns are mounted for each component.

6. The semiconductor characteristic evaluation apparatus according to claim 5, wherein in the plurality of measurement units, a part of the plurality of areas is shared by setting n (n>1) measurement units as a unit.

7. The semiconductor characteristic evaluation apparatus according to claim 1, wherein the measurement bus group has a first bus arranged in a stripe shape and a second bus arranged in a mesh shape.

8. The semiconductor characteristic evaluation apparatus according to claim 7, wherein for the second bus, a vertical bus and a lateral bus are interconnected to be fixed at equal potentials.

9. The semiconductor characteristic evaluation apparatus according to claim 8, wherein the second bus is divided into a plurality of groups.

10. The semiconductor characteristic evaluation apparatus according to claim 1, wherein the control circuit is arranged on an outer peripheral part of the chip.

11. The semiconductor characteristic evaluation apparatus according to claim 1, wherein one of the components configuring the semiconductor integrated circuit is a metal oxide semiconductor (MOS) transistor; sources and drains of all the transistors among the plurality of measured patterns formed by a plurality of integrated circuits including the MOS transistors are directly connected to the second bus of the measurement bus group arranged in the mesh shape; a gate of a selected transistor is connected through a switch circuit to the second bus allocated for gate bias application; and a gate of an unselected transistor is connected through the switch circuit to the second bus allocated for an off-bias application in which a potential is independently controlled from the outside of the chip.

12. The semiconductor characteristic evaluation apparatus according to claim 1, wherein one of the components configuring the semiconductor integrated circuit is a capacity; for the plurality of measured patterns formed by the plurality of integrated circuits including the capacity, a driving clock signal is supplied through the first bus of the measurement bus group arranged in the stripe shape; and a measurement current obtained by capacity-current conversion is outputted through the first bus of the measurement bus group arranged in the stripe shape.

13. The semiconductor characteristic evaluation apparatus according to claim 12, wherein the first bus through which the driving clock signal is supplied is configured by using a low capacity wiring where a parasitic capacitance is reduced to 0.1 pF/mm; and the first bus through which the measurement current is outputted is configured by using a low capacity and low resistance wiring where a parasitic capacitance is reduced to 0.12 pF/mm and wiring resistance is reduced to 500 Ω/mm.

14. The semiconductor characteristic evaluation apparatus according to claim 12, wherein a selection circuit common to each measurement unit is inserted between the plurality of measured patterns formed by the plurality of integrated circuits and the first bus through which the measurement current is outputted.

15. The semiconductor characteristic evaluation apparatus according to claim 14, wherein the selection circuit is configured by a p-type metal oxide semi-conductor (MOS) transistor; a well and a source of the p-type MOS transistor are connected to each other; and a well and a source of each p-type MOS transistor are connected to each other in the plurality of measured patterns to which the p-type MOS transistor is connected.

* * * * *